United States Patent [19]

Robbins

[11] 3,872,492

[45] Mar. 18, 1975

[54] RADIATION HARDENED FIELD EFFECT TRANSISTOR

[75] Inventor: Lionel Robbins, Orchard Lake, Mich.

[73] Assignee: Energy Conversion Devices, Inc., Troy, Mich.

[22] Filed: July 26, 1972

[21] Appl. No.: 275,138

[52] U.S. Cl. .......................... 357/23, 357/2, 357/29, 357/4

[51] Int. Cl. .......................... H01l 5/06, H01l 11/14

[58] Field of Search ........ 317/234 V, 235 B, 235 G, 317/235 N

[56] References Cited

UNITED STATES PATENTS

| | | | |
|---|---|---|---|
| 3,571,673 | 3/1971 | Ovshinsky et al. | 317/234 V |
| 3,657,006 | 4/1972 | Fisher | 317/234 V |

OTHER PUBLICATIONS

Waxman et al., Appl. Phys. Lett., Vol. 12, No. 3, Feb. 1, 1968, pp. 109–110.

Adler, Electronics, Sept. 28, 1970, p. 61.

Matare, State State Technology, Jan., 1969, pp. 43–44.

*Primary Examiner*—Rudolph V. Rolinec
*Assistant Examiner*—William D. Larkins
*Attorney, Agent, or Firm*—Charles B. Spangenberg

[57] ABSTRACT

In a field effect transistor, including a semiconductor element, a source and drain, a gate and an insulator between the gate and the semiconductor element, the insulator thereof comprises an amorphous insulating semiconductor material instead of a dielectric material for radiation hardening purposes. The amorphous insulating semiconductor material has a high glass transition temperature, a large band gap and substantially no current carrier centers having activation energies substantially less than the band gap, and substantially satisfied chemical bonds. Accordingly, the insulator has high stability and resistivity, substantially no tendency to react or alloy with the semiconductor element and gate, and substantially no deep traps so that charges caused by external radiation are not trapped therein and internal fields due to such charges are substantially immediately neutralized in said insulator.

21 Claims, 2 Drawing Figures

RADIATION HARDENED FIELD EFFECT TRANSISTOR

Figure 1:
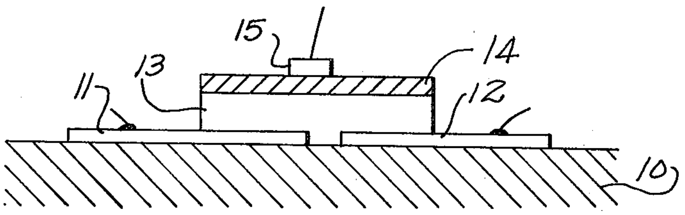

Conventional field effect transistors include a semiconductor element, a source and drain, a gate and a dielectric insulator between the gate and the semiconductor element for controlling current through the semiconductor element between the source and drain in accordance with voltage signals applied to the gate. Such transistors have a threshold voltage value which must be exceeded by the voltage signal applied to the gate in order for the transistor to conduct current, and for satisfactory operation of the transistor this threshold voltage value must remain substantially constant.

However, such conventional field effect transistors are subject to the effects of external radiation, they experiencing a shift in threshold voltage value in response to a total dose of gamma radiation which renders them inoperative for their intended purposes. This is caused by a build-up of charge in the dielectric insulator or at the interface between the dielectric insulator and the semiconductor element brought about by the external radiation. Such charge build-up in the dielectric insulator establishes internal fields therein which in turn operate to shift the threshold voltage value of the transistor. These disadvantages and problems have been in existence for a long period of time and while many efforts have been made to solve this problem, no solution has been forthcoming.

The principal object of this invention is to solve this problem and eliminate or minimize the foregoing disadvantages of the conventional field effect transistors, and to provide a radiation hardened field effect transistor wherein the threshold voltage value thereof is maintained substantially constant regardless of the effects of external radiation such as gamma radiation.

Briefly, in accordance with this invention an insulator comprising an amorphous insulating semiconductor material is substituted for the conventional dielectric insulators. Such an amorphous insulating semiconductor material has substantially no deep traps so that charges caused by external radiation are not trapped therein and internal fields due to such charges are substantially immediately neutralized in the insulator. This is to be distinguished from conventional dielectric insulators which do have deep traps and which are subject to the aforementioned problems.

Also, the amorphous semiconductor material of the insulator has a high glass transition temperature to provide high stability, and has a large band gap and substantially no current carrier centers (donors and acceptors) having activation energies substantially less than the band gap to provide high resistivity. While the conventional dielectric insulators have a much greater band gap, they do have substantial current carrier centers having activation energies substantially less than the band gap so that the resistivity thereof is comparable to that of the amorphous insulating semiconductor material of this invention.

The amorphous semiconductor material of the insulator also has substantially satisfied chemical bonds, i.e. chemical bonds which are satisfied to a high degree, and includes saturated cross-linked alloy glasses which may be chalcogenide glasses or otherwise. These substantially satisfied chemical bonds substantially eliminate any tendency for the insulator to react or alloy with the semiconductor element and gate, and they also substantially eliminate deep traps so that charges caused by external radiation are not trapped therein and internal fields due to such charges are substantially immediately neutralized in the insulator.

Further objects and advantages of this invention reside in the details of construction of the radiation hardened field effect transistor and in the cooperative relationships between the component parts thereof.

Figure 2:
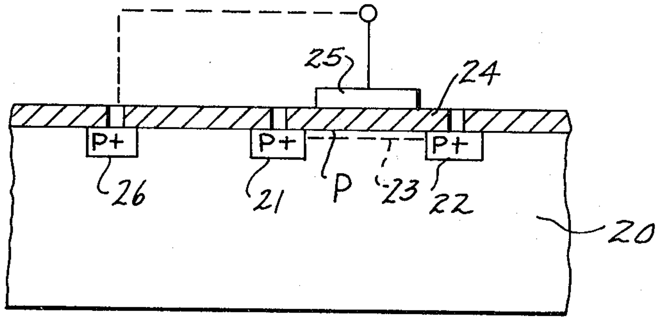

Other objects and advantages of this invention will become apparent to those skilled in the art upon reference to the accompanying application, claims and drawing, in which:

FIG. 1 is a diagrammatic view of a field effect transistor utilizing thin films; and FIG. 2 is a diagrammatic view of a field effect transistor utilizing a doped semiconductor substrate.

Referring first to FIG. 1 a pair of electrodes including a source electrode 11 and a drain electrode 12 is deposited on the substrate in spaced apart position. A semiconducting layer 13 is deposited over the source and drain and forms the semiconductor element. An insulator 14 is deposited over the semiconductor element 13 and a gate electrode 15 is deposited over the insulator 14. The source and drain electrodes 11, 12 are preferably formed of a metal such as molybdenum or other refractory metal. The semiconductor element 13 may include semiconductor materials, such as, CdSe, CdS, $Ga_2AsP$ which are conventional in this type of field effect transistor. Normally these semiconductor elements are in crystalline or polycrystalline form.

In the conventional field effect transistors the insulator 14 is usually formed of $SiO_2$ and from time to time $Al_2O_3$, $GaPO_4$, $Si_3N_4$, $Si_3N_4$ — $SiO_2$ sandwich and homogeneous Si — $N_x$ — $O_y$ materials have been substituted therefor. These insulating materials have wide band gaps in the range of about 5 to 7.5 eV and have deep traps. Also they have substantial current carrier centers (donors and/or acceptors) having activation energies substantially less than the band gap and as a result the resistivities of these materials are in the range of about $10^{12}$ to $10^{14}$ ohm cm or more.

The gate 15 may be made of any suitable metal such as molybdenum or other refractory metal.

In accordance with the instant invention an amorphous insulating semiconductor material is utilized for the insulator 14 rather than the aforementioned dielectric insulators. Various amorphous insulating semiconductor materials may be used, as for example, chalcogenide saturated cross-linked alloy glasses such as $GeS_2$, $As_2S_3$, $As_2Se_3$, $GeSe_2$ or the like. Non-chalcogenide saturated cross-linked alloy glasses may also be used, such as, arsenide or phosphide glasses, including $ZnGeP_2$, $ZnSiP_2$, $ZnSiAs_2$, $CdSiP_2$, or the like. These various amorphous insulating semiconductor materials have band gaps in the range of about 1.95 to 3.2 eV with resistivities in the range of about $10^{13}$ to $10^{16}$ ohm cm. These high resistivities in these materials are possible since there are substantially no current carrier centers (donors and/or acceptors) having activation energies substantially less than the band gap. These materials also have a high glass transition temperature which provides high stability as well as high resistivity. These materials also have substantially satisfied chemical bonds so that there will be substantially no tendency to react or alloy with the semiconductor element 13 and gate 15 and substantially no deep traps so that charges caused by external radiation are not trapped therein and internal fields due to such charges are substantially immediately neutralized in the amorphous insulating semiconductor insulator, which is not the case in the dielectric insulators of the conventional transistors which do have deep traps for trapping therein the charges caused by external radiation to produce internal fields therein. If some deep traps should be present, the concentration of them may be further reduced by annealing.

Referring now to FIG. 2 an n-type silicon substrate 20 is utilized, and it is heavily doped to the p+ type to form a conductive source 21 and a conductive drain 22 at spaced apart points therein. The n-type silicon substrate is also lightly doped to the p-type between the source and drain 21, 22 to form the semiconductor element 23 therein between the source and drain. An insulating layer 24 is deposited over the substrate 20 and in the conventional field effect transistor this insulating layer 24 is a dielectric insulator utilizing $SiO_2$ or the other dielectric materials referred to above in connection with FIG. 1. The gate 25 is deposited over the insulating layer and this gate may be suitably connected to another heavily doped p+ type portion of the substrate as indicated at 26. Also in accordance with this form of the invention amorphous insulating semiconductor materials as described above may be substituted for the conventional dielectric materials. What has been said above in connection with FIG. 1 as to the differences between the instant invention and the conventional field effect transistors applies equally as well here and a further description is not considered necessary.

By utilizing the amorphous insulating semiconductor materials in lieu of the conventional dielectric materials, charges caused by external radiation are not trapped in the insulator and internal fields due to such charges are substantially immediately neutralized in the insulator. As a result there is substantially no shift in threshold voltage values in response to external radiation, such as, a total dose of gamma radiation, so that the field effect transistors of this invention are radiation hardened in this respect and form a decided improvement over the conventional field effect transistors.

Also in accordance with this invention the semiconductor element 13 of FIG. 1 may be formed of an amorphous conducting semiconductor material such as amorphous silicon which may be suitably deposited over the source and drain 11, 12. Such amorphous silicon may have a band gap of about 1.24 eV and resistivities of the amorphous insulating semiconductor materials. Because of the amorphous nature of the amorphous silicon semiconductor element it will also be substantially immune to external radiation and hence will operate to increase the radiation hardness of the entire field effect transistor.

While for purposes of illustration several forms of this invention have been disclosed, other forms thereof may become apparent to those skilled in the art upon reference to this disclosure and, therefore, this invention should be limited only by the scope of the appended claims.

I claim:

1. A radiation hardened field effect transistor including a semiconductor element, a source and a drain at spaced apart points along the semiconductor element, a gate for the semiconductor element for controlling current through the semiconductor element between the source and drain and an insulator between the gate and the semiconductor element, wherein said insulator comprises an amorphous non-oxidic insulating semiconductor material comprising a saturated cross-linked alloy glass selected from the group consisting of chalcogenides, arsenides and phosphides having substantially no deep traps so that charges caused by external radiation are not trapped therein and internal fields due to such charges are substantially immediately neutralized in said insulator.

2. A radiation hardened field effect transistor as defined in claim 1 wherein said amorphous insulating semiconductor material comprises a chalcogenide saturated cross-linked alloy glass.

3. A radiation hardened field effect transistor as defined in claim 2 wherein said chalcogenide saturated crosslinked alloy glass comprises $GeS_2$, $As_2S_3$, $As_2Se_3$, or $GeSe_2$.

4. A radiation hardened field effect transistor as defined in claim 1 wherein said amorphous insulating semiconductor material comprises a non-chalcogenide saturated cross-linked arsenide or phosphide alloy glass.

5. A radiation hardened field effect transistor as defined in claim 4 wherein said non-chalcogenide saturated crosslinked arsenide or phosphide alloy glass comprises $ZnGeP_2$, $ZnSiP_2$, $ZnSiAs_2$, or $CdSiP_2$.

6. A radiation hardened field effect transistor as defined in claim 1 wherein said semiconductor element comprises an amorphous conducting semiconductor material.

7. A radiation hardened field effect transistor as defined in claim 6 wherein said amorphous conducting semiconductor material comprises amorphous silicon.

8. A radiation hardened field effect transistor including a semiconductor element, a source and a drain at spaced apart points along the semiconductor element, a gate for the semiconductor element for controlling current through the semiconductor element between the source and drain and an insulator between the gate and the semiconductor element, wherein said insulator comprises an amorphous non-oxidic semiconductor material comprising a saturated cross-linked alloy glass selected from the group consisting of chalcogenides, arsenides and phosphides having high resistivity, substantially no tendency to react or alloy with the semiconductor element and gate, and substantially no deep traps so that charges caused by external radiation are not trapped therein and internal fields due to such charges are substantially immediately neutralized in said insulator.

9. A radiation hardened field effect transistor as defined in claim 8 wherein said amorphous semiconductor material comprises a chalcogenide saturated crosslinked alloy glass.

10. A radiation hardened field effect transistor as defined in claim 9 wherein said chalcogenide saturated crosslinked alloy glass comprises $GeS_2$, $As_2S_3$, $As_2Se_3$, or $GeSe_2$.

11. A radiation hardened field effect transistor as defined in claim 8 wherein said amorphous semiconductor material comprises a non-chalcogenide saturated cross-linked arsenide or phosphide alloy glass.

12. A radiation hardened field effect transistor as defined in claim 11 wherein said non-chalcogenide saturated cross-linked alloy arsenide or phosphide glass comprises $ZnGeP_2$, $ZnSiP_2$, $ZnSiAs_2$, or $CdSiP_2$.

13. A radiation hardened field effect transistor as defined in claim 8 wherein said semiconductor element comprises an amorphous semiconductor material having a resistivity substantially lower than the resitivity of the amorphous semiconductor material of the insulator.

14. A radiation hardened field effect transistor as defined in claim 13 wherein said amorphous semiconductor material of said semiconductor element comprises amorphous silicon.

15. A radiation hardened field effect transistor including a semiconductor element, a source and a drain at spaced apart points along the semiconductor element, a gate for the semiconductor element for controlling current through the semiconductor element between the source and drain and an insulator between the gate and the semiconductor element, wherein said insulator comprises an amorphous non-oxidic semiconductor material comprising a saturated cross-linked alloy glass selected from the group consisting of chalcogenides, arsenides and phosphides having a high glass transition temperature, a large band gap and substantially no current carrier centers having activation energies substantially less than the band gap, and substantially satisfied chemical bonds, whereby said insulator has high stability and resistivity, substantially no tendency to react or alloy with the semiconductor element and gate, and substantially no deep traps so that charges caused by external radiation are not trapped therein and internal fields due to such charges are substantially immediately neutralized in said insulator.

16. A radiation hardened field effect transistor as defined in claim 15 wherein said amorphous semiconductor material comprises a chalcogenide saturated crosslinked alloy glass.

17. A radiation hardened field effect transistor as defined in claim 16 wherein said chalcogenide saturated crosslinked alloy glass comprises $GeS_2$, $As_2S_3$, $As_2Se_3$, or $GeSe_2$.

18. A radiation hardened field effect transistor as defined in claim 15 wherein said amorphous semiconductor material comprises a non-chalcogenide saturated cross-linked arsenide or phosphide alloy glass.

19. A radiation hardened field effect transistor as defined in claim 18 wherein said non-chalcogenide saturated cross-linked alloy arsenide or phosphide glass comprises $ZnGeP_2$, $ZnSiP_2ZnSiAs_2$, or $CdSiP_2$.

20. A radiation hardened field effect transistor as defined in claim 15 wherein said semiconductor element comprises an amorphous semiconductor material having a resistivity substantially lower than the resistivity of the amorphous semiconductor material of the insulator.

21. A radiation hardened field effect transistor as defined in claim 20 wherein said amorphous semiconductor material of said semiconductor element comprises amorphous silicon.

* * * * *